(12) United States Patent
Peng

(10) Patent No.: US 7,430,129 B1
(45) Date of Patent: Sep. 30, 2008

(54) POSITIONING ASSEMBLY

(75) Inventor: Ying-Chao Peng, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/869,825

(22) Filed: Oct. 10, 2007

(51) Int. Cl.
*H05K 7/12* (2006.01)
*H05K 7/14* (2006.01)

(52) U.S. Cl. .................. 361/807; 361/809; 361/742; 361/758; 174/138 E; 174/138 G

(58) Field of Classification Search ......... 361/807–810, 361/742, 758, 770, 804, 740, 759; 174/138 E, 174/138 G
See application file for complete search history.

(56) References Cited

U.S. PATENT DOCUMENTS

| | | | | |
|---|---|---|---|---|
| 4,167,772 A | * | 9/1979 | Baehne | 361/758 |
| 4,629,356 A | * | 12/1986 | Hayashi | 403/408.1 |
| 5,691,504 A | * | 11/1997 | Sands et al. | 174/372 |
| 6,259,032 B1 | * | 7/2001 | Fernandez | 174/138 E |
| 6,362,978 B1 | * | 3/2002 | Boe | 361/825 |
| 6,424,538 B1 | * | 7/2002 | Paquin | 361/752 |
| 6,695,629 B1 | * | 2/2004 | Mayer | 439/92 |
| 6,771,516 B1 | * | 8/2004 | Leman et al. | 361/825 |
| 6,937,475 B2 | * | 8/2005 | Rigimbal et al. | 361/752 |
| 7,106,601 B2 | * | 9/2006 | Chen et al. | 361/801 |
| 7,245,496 B1 | * | 7/2007 | Luo et al. | 361/742 |
| 7,385,830 B2 | * | 6/2008 | Liu et al. | 361/810 |

* cited by examiner

*Primary Examiner*—Dean A. Reichard
*Assistant Examiner*—Dameon E Levi
(74) *Attorney, Agent, or Firm*—Workman Nydegger

(57) ABSTRACT

A positioning assembly is used for positioning a circuit board on a case. The circuit board shifts relative to a case along a integrate direction or a release direction. The positioning assembly includes a fixed member, a movable member, and a latching member. The latching member is disposed on a side surface of the circuit board, and the fixed member is disposed to the case, for the latching member to pass through in a single direction along a integrate direction, such that the latching member is stopped at one end of the fixed member, thereby positioning the circuit board case. The movable member makes the fixed member spread and deform, such that the latching member passes through the fixed member in an opposite direction along a release direction, so that the circuit board may fixed on or detached from the case.

10 Claims, 5 Drawing Sheets

POSITIONING ASSEMBLY

BACKGROUND OF THE INVENTION

1. Field of Invention

The present invention relates to a positioning assembly. More particularly, the present invention relates to a positioning assembly for locking and fixing a circuit board without bolts.

2. Related Art

Currently, with the rapid development of science, technology and information, a computer device has become a quite popular electronic device. In the current market, computer devices, such as desktop computers, notebook computers, or servers, are all provided with a mainboard therein as a kernel member of a compute system, so that computer peripheral hardware, such as a central processing unit (CPU), a memory module, and a PCI card, electrically connected to the mainboard may perform default functions smoothly.

The mainboard is usually fixed as follows. A plurality of conductive bosses is formed on a case of a computer device as fixing means, and a plurality of through holes corresponding to the conductive bosses is formed in the mainboard. The mainboard is laid on the conductive bosses to keep a suitable distance from the case, and then, a plurality of bolts penetrate the through holes of the mainboard, and are locked on the conductive bosses, with a result that the mainboard is suspended by the aid of the conductive bosses, and leg contacts on the back side of the mainboard are prevented from directly contacting the case to cause a short circuit.

With regard to the conventional method of locking and fixing the mainboard by the conductive bosses, when the mainboard is being mounted and dismounted, a user has to lock and release the bolts one by one with the same actions, which is quite complicated and time-consuming and also inconvenient in practical use. Furthermore, the present electronic device is required to be light, thin, short, and small, but too many conductive bosses will occupy more area of the mainboard. The circuit layout on the mainboard cannot be achieved easily, and the volume of the whole electronic device cannot be microminiaturized, either.

In recent years, a thumb screw emerges, which may be screwed directly by hand, so as to serve as a positioning means for fixing the mainboard. As shown in FIG. 1, it is a schematic view of fixing a circuit board 20 on a case 10 using a thumb screw 60 under a normal circumstance. The case 10 has a plurality of positioning posts 11 with a screw hole 61, in which a slot 12 is formed around the middle portion of each positioning post 11. The circuit board 20 has a plurality of positioning holes 21 corresponding to the positioning posts 11. Each of the positioning holes 21 shapes like a calabash and has a wide section 22 and a narrow section 23, and the front end of each positioning post 11 penetrates the wide section 22 of the positioning hole 21. In this manner, the circuit board 20 may slide on the case 10 by the positioning posts 11, so that the narrow section 23 of each of the positioning hole 21 is engaged into each of the slot 12 of the positioning posts 11. Subsequently, the circuit board 20 may be fixed on the case 10 merely by making the thumb screw 60 penetrate the circuit board 20 and screw it into the screw hole 61.

However, the method of fixing the motherboard by using the thumb screw is still a locking method by screwing and through this method, the process of mounting and dismounting the mainboard is complicated, not only the cost time is too long, but also the cost of the thumb screw is higher than that of conventional bolt, such that material cost and manpower cost are increased. Therefore, recently it is a problem urgently to be overcome by persons skilled in the art how to truly fix the mainboard in a screwless manner and enable users to mount and dismount the mainboard rapidly and conveniently.

SUMMARY OF THE INVENTION

In view of the above problem, the present invention provides a positioning assembly, so as to solve the problems in the conventional art that because the mainboard is mounted and dismounted by a screwing manner, the volume of an electronic device cannot be microminiaturized, and the mounting and dismounting period is too complicated and time-consuming, thereby causing a high manufacturing cost and inconvenience in operation.

The positioning assembly disclosed in the present invention is used to position a circuit board on a case, in which the circuit board shifts relative to a case along a integrate direction or a release direction, so as to get caught by the case or be detached from the case. The positioning assembly includes a fixed member, a movable member, and a latching member. The fixed member is fixed on the case and has two suspending elastic arms opposite to each other, and one side of the two elastic arms forms a claw. The movable member has two opposite guide chamfers movably contacting with the two elastic arms of the fixed member, for shifting relative to the fixed member, such that the two elastic arms deform to expand the width of the claw. The latching member is mounted on one side of the circuit board corresponding to the movable member, and the width of the latching member is greater than the width of the claw of the fixed member. When the latching member shifts with the circuit board along the integrate direction, the latching member pushes the claw of the two elastic arms to deform, and moves to a top end of the claw. The top end of the claw of the two elastic arms leans against the latching member by returning of the deformation of the two elastic arms. In this manner, the circuit board is fixed on the case.

Therefore, the efficacy of the present invention is that the circuit board of the electronic device can be quickly and stably mounted on the case by the stopping of the positioning assembly. In other words, because of the special design of the positioning assembly of the present invention, when the circuit board is mounted on the case, as long as the circuit board is pushed along the integrate direction, the circuit board is stably mounted on the case. In this manner, not only it is not necessary to lock or dismount a plurality of screws by screwing, but also it is further possible to mount and dismount the circuit board easily and quickly, thereby reducing the manpower cost required by locking, and fixing the circuit board in the screwless manner at the same time.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The positioning assembly of the present invention is applied in an electronic device which likes a computer device provided with a circuit board to execute actions, such as desktop computers, notebook computers, and severs. In the following detailed description of the present invention, the notebook is used as a preferred embodiment of the present invention. The accompanied drawings are merely provided for reference and illustration and are not intended to limit the present invention.

Figure 1:
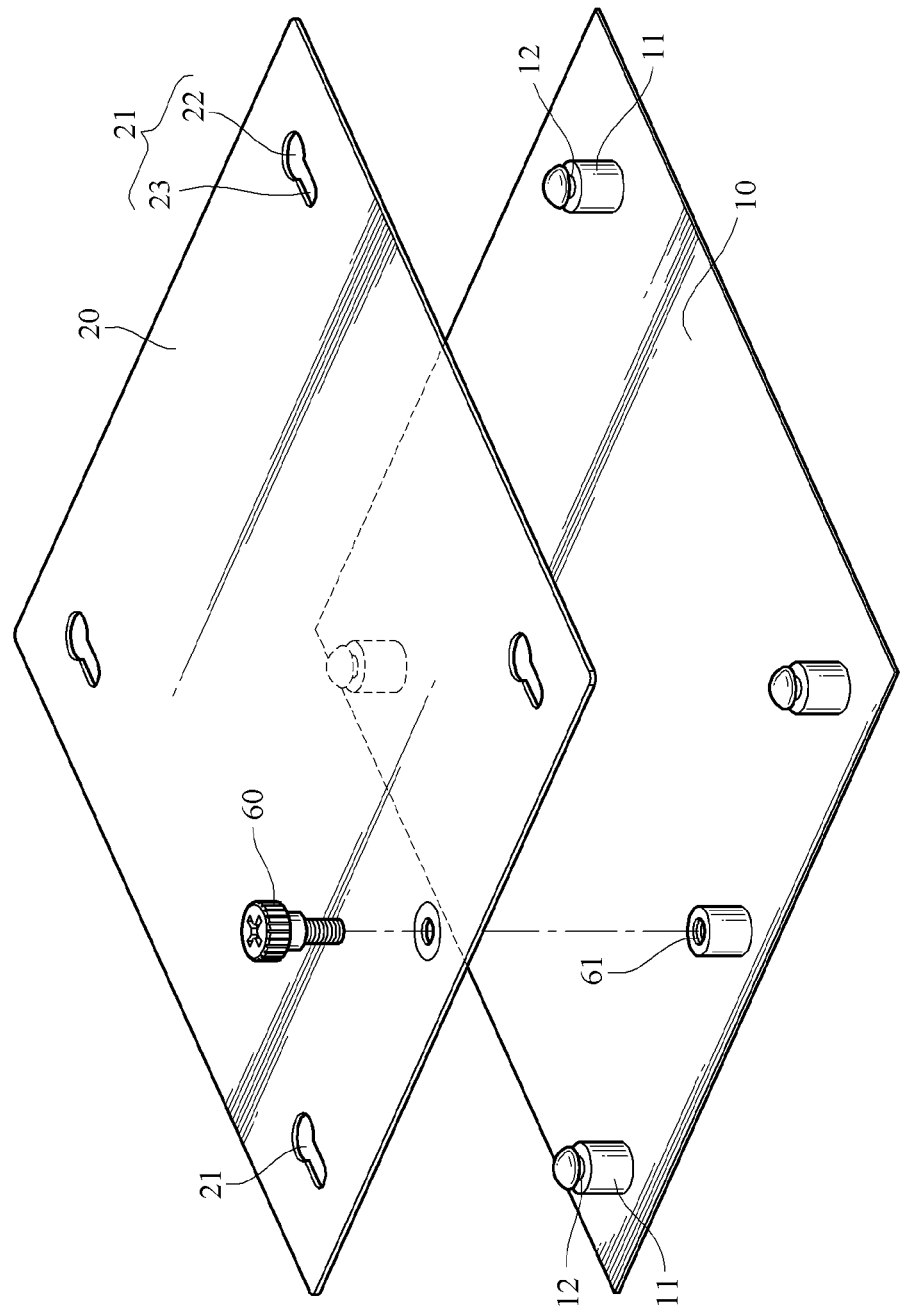
FIG. 1 is an exploded view of the conventional art.
Figure 2:
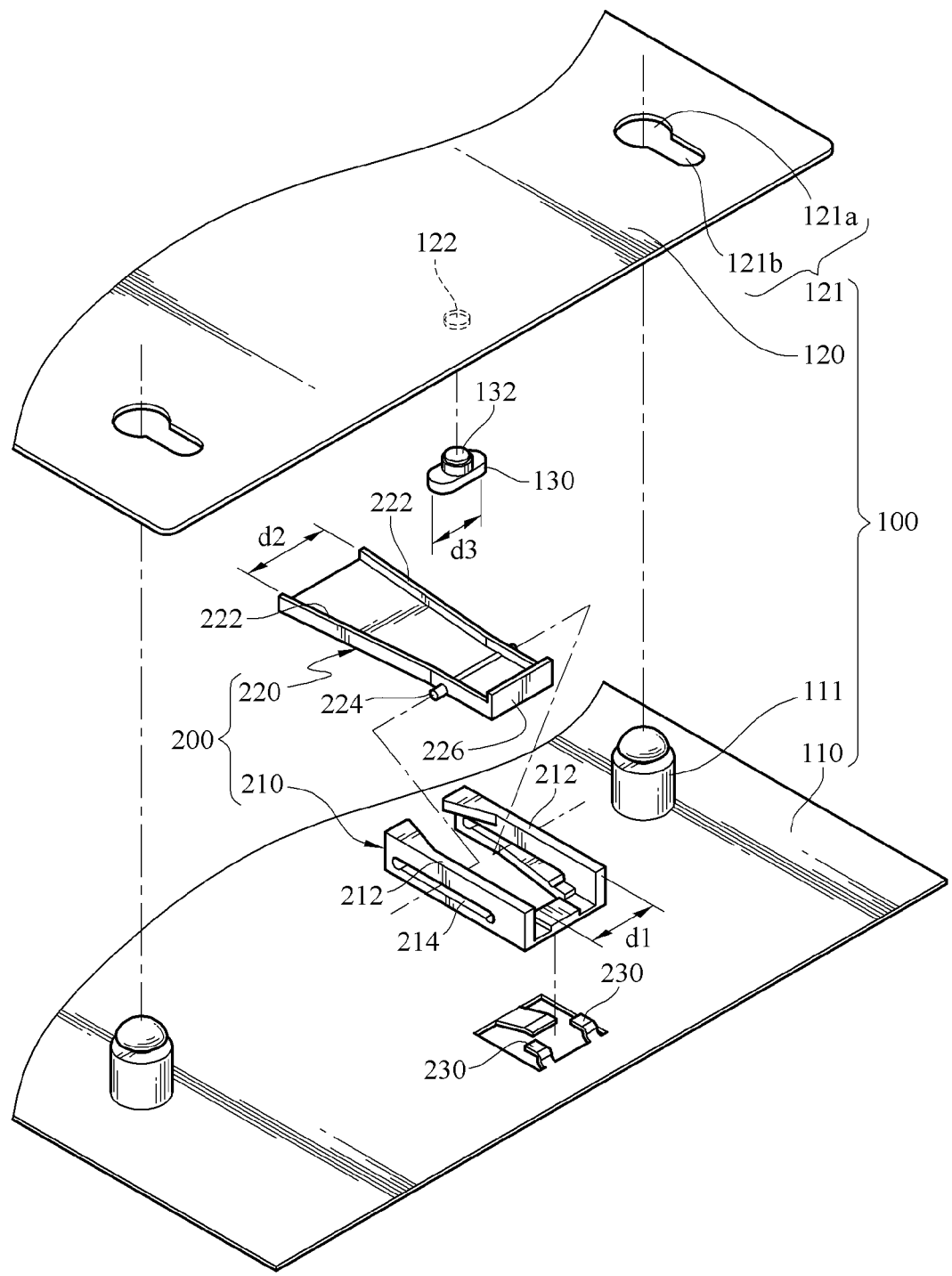
FIG. 2 is an exploded view of an embodiment of the present invention.

Referring to FIG. 2, an exploded view of an embodiment of the present invention is shown. A positioning assembly 200 of the present invention is applied to an electronic device 100, and the positioning assembly 200 is used to lean against a movable latching member 130. The electronic device 100 has a case 110 and a circuit board 120, and the latching member 130 is disposed on a side of the circuit board 120 corresponding to the case 110. At least one combination post 111 is disposed on the case 110, and at least one combination hole 121 is opened on the circuit board 120, in which the combination post 222 is a columnar structure having a top end size greater than the post body size, and the combination hole 121 is a gourd shaped structure composed of a big hole 121a and a small hole 121b extending from the circumference of the big hole 121a. A front end of the combination post 111 passes through the combination hole 121 from the big hole 121a, at this time, the circuit board 120 can slide on the case 110 through the combination post 111, such that the small hole 121b of the combination hole 121 is engaged in a recess on the top end of the combination post 111. In this manner, the circuit board 120 can shift relative to the case 110 along the integrate direction or the release direction, such that the combination post 111 and the combination hole 121 combine with each other, and the circuit board 120 gets caught to the case 110 or be detached from the case 110.

A hole 122 is further disposed on the circuit board 120, and a bump 132 corresponding to the hole 122 is provided at one end of the latching member 130, the bump 132 and the hole 122 are engaged with each other, such that the latching member 130 is secured on one side of the circuit board 120 corresponding to the case 110.

Referring to FIG. 2, the positioning assembly 200 includes a fixed member 210 and a movable member 220. The fixed member 210 is fixed on the case 110, and has two suspending elastic arms 212 spaced by a first width $d_1$. The two elastic arms 212 normally maintain the first width $d_1$, and the two elastic arms 212 can generate elastic deformation under stress. The first width $d_1$ is smaller than a width $d_3$ of the latching member 130. In an embodiment of the present invention, at the suspending ends of the two elastic arms 212 forms a claw, in which the width of the claw is smaller than the width $d_3$ of the latching member 130. In other embodiments of the present invention, a hook 230 on the case 110 can be further used to hook the fixed member 210, so as to fix the fixed member 210 on the case 110.

The fixed member 210 can further include two slots 214 respectively disposed to the two elastic arms 212.

As shown in FIG. 2, the movable member 220 is movably disposed on the fixed member 210, and the movable member 220 has a second width $d_2$, in which the second width $d_2$ is greater than the first width $d_1$. In an embodiment of the present invention, the movable member 220 can further include two opposite guide chamfers 222, and a pivot 224 is respectively disposed on one side of the two guide chamfers 222 corresponding to the slots 214. The two pivots 224 are respectively inserted in the two slots 214, so as to guide the movable member 220 to shift relative to the fixed part 210, such that the movable member 220 movably contact with the two elastic arms 212 through the two guide chamfers 222. The movable member 220 further includes a protruding rib 226 neighbored between one ends of the two guide chamfers 222, so as to drive the movable member 220 to remove relative to the fixed member 210.

Figure 3:
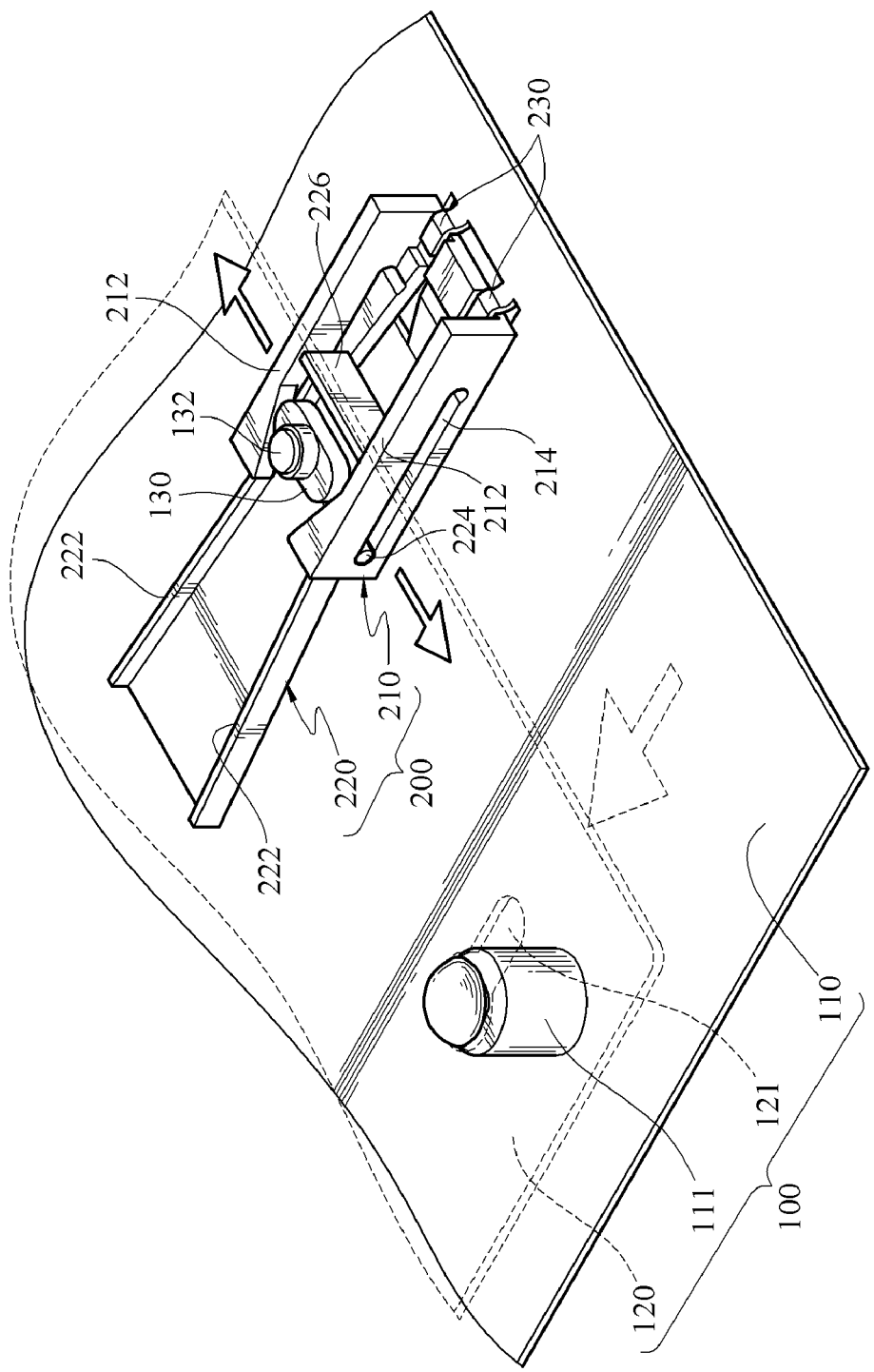
FIG. 3 is a perspective view of the circuit board of the present invention in a mounting state.

Referring to FIG. 3, a perspective view of the circuit board of the present invention in a mounting state is shown. When the latching member 130 shifts with the circuit board 120 along the integrate direction, because the width $d_3$ of the latching member 130 is greater than the first width $d_1$ of the two elastic arms 212, the latching member 130 pushes the two elastic arms 212 to deform.

Figure 4:
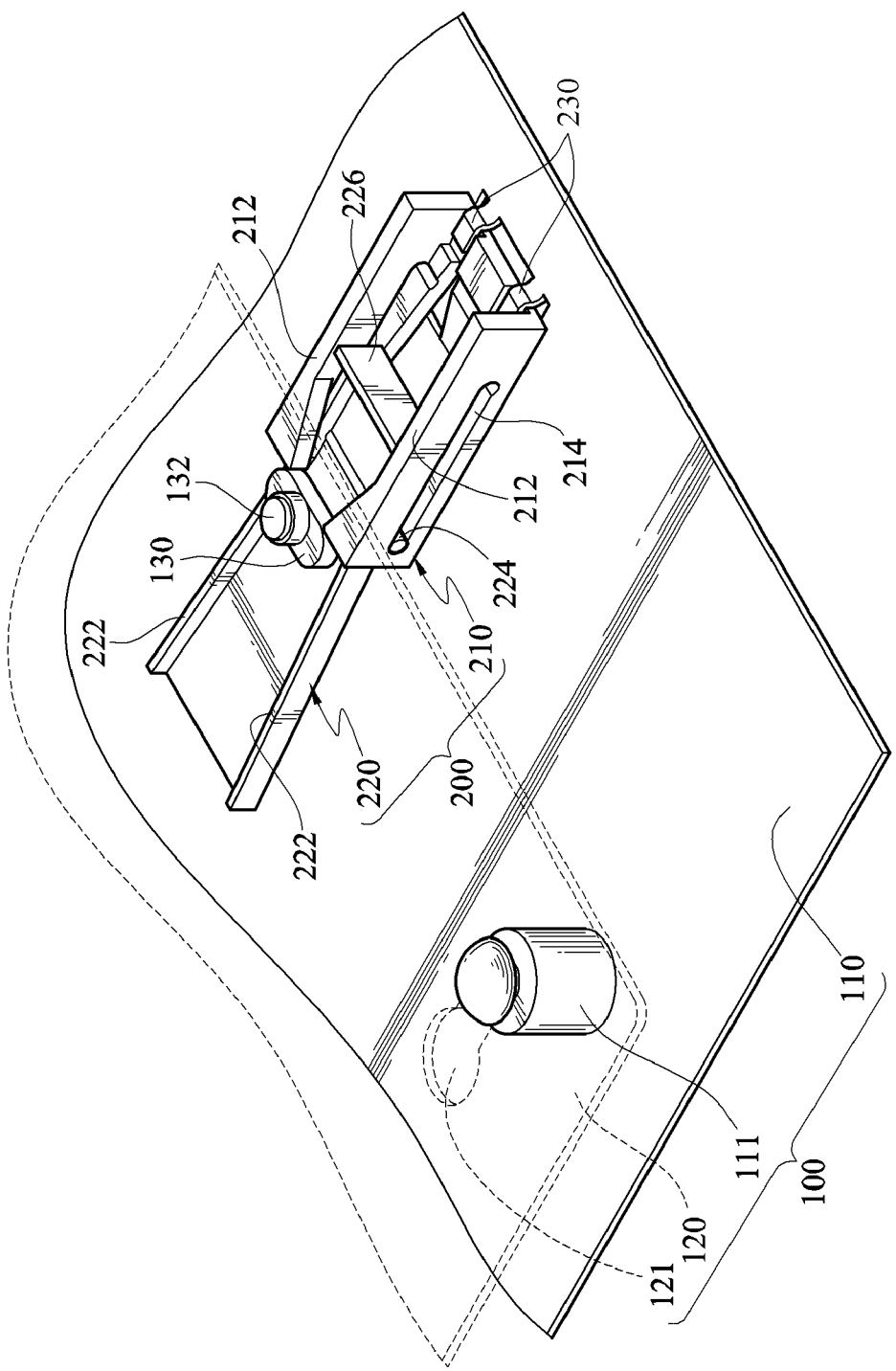
FIG. 4 is a perspective view of the circuit board of the present invention in a combined state.

Referring to FIG. 4, a perspective view of the circuit board of the present invention in a combined state is shown. As shown in FIG. 4, the latching member 130 continuously shifts with the circuit board 120 towards the integrate direction, until the combination hole 121 and the combination post 111 are combined with each other. More particularly, when the latching member 130 continuously moves towards the integrate direction to the claw of the two elastic arms 212, because the width $d_3$ of the latching member 130 is greater than the width of the claw of the two elastic arms 212, the latching member 130 pushes the two elastic arms 212 to deform, and moves to the top end of the two elastic arms 212, that is, moves to the top end of the claw of the two elastic arms 212. At this time, the top ends of the two elastic arms 212 (or the top ends of the claw of the two elastic arms 212) lean against the latching member 130, and limit the latching member 130 through returning of the deformation of the two elastic arms 212. In this manner, the circuit board 120 is fixed on the case 110.

Figure 5:
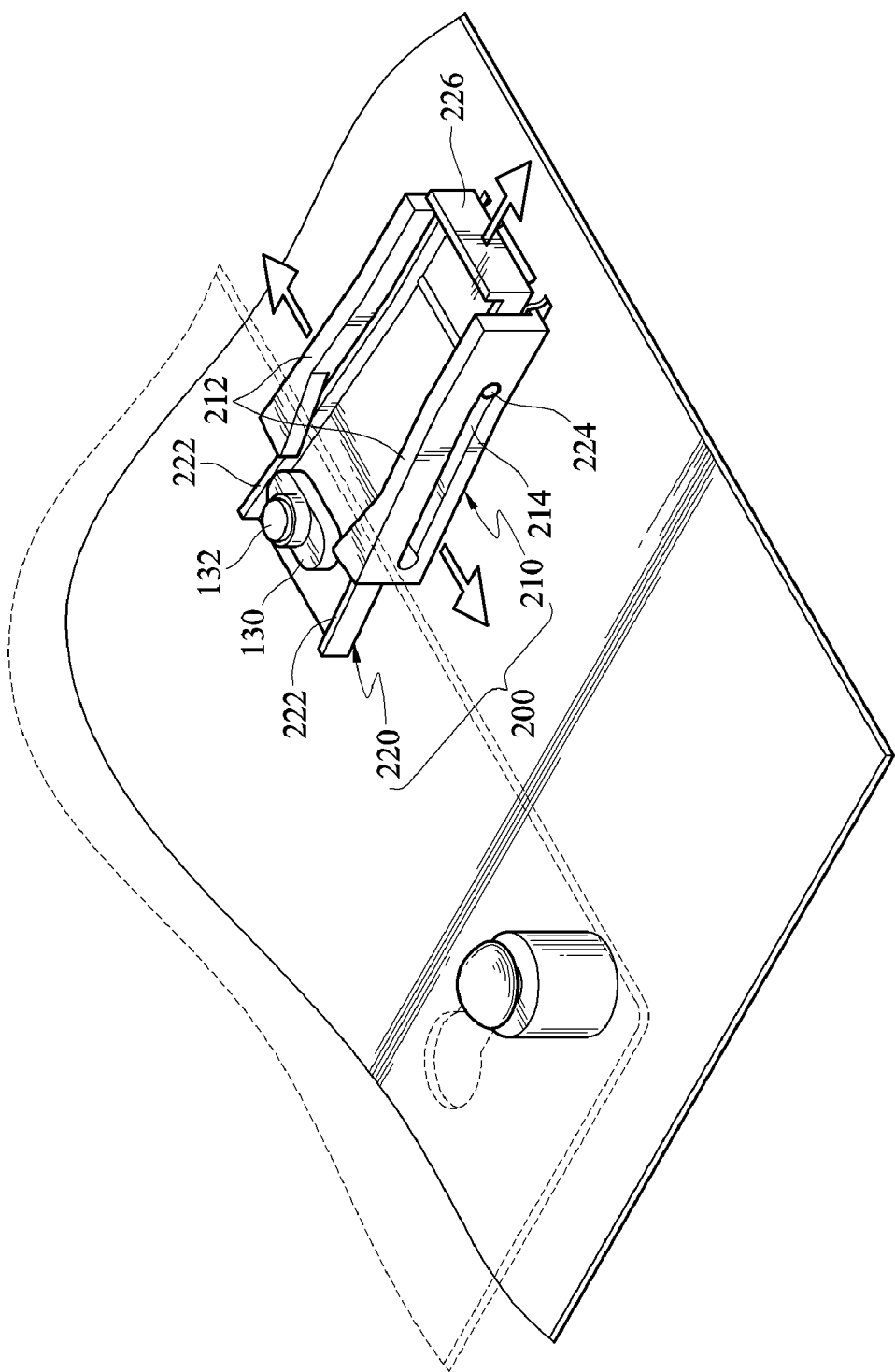
FIG. 5 is a perspective view of the circuit board of the present invention in a releasing state.

Referring to FIG. 5, a perspective view of the circuit board of the present invention in a releasing state is shown. As shown in FIG. 5, when it intends to detach the circuit board 120 from the case 110, the movable member 220 is made to move towards the release direction under external force. At this time, the second width $d_2$ of the movable member 220 is greater than the first width $d_1$, the movable member 220 pushes the two elastic arms 212 to deform, so as to spread the two elastic arms 212, and to make the first width $d_1$ deform to a third width. When the third width is greater than the width $d_3$ of the latching member 130, the latching member 130 can shift along the release direction and be separate from the top end of the claw of the two elastic arms 212. In this manner, the circuit board 120 can be detached from the case 110. In an embodiment of the present invention, an external force is applied to the protruding rib 226 of the movable member 220, so as to drive the movable member 220 to move towards the release direction.

The positioning assembly of the present invention provides a stopping and fixing function, such that the circuit board is stably mounted on the case without using a plurality of groups of bolts to fix the circuit board, thereby really fixing the circuit board in the screwless manner. Further, through the special design of the positioning assembly of the present invention, when the circuit board is mounted on the case, as long as the circuit board is pushed along the integrate direction, the circuit board is stably mounted on the case. In this manner, not only it is not necessary to lock or detach a plurality of screws by screwing, but also it is further possible to mount and dismount the circuit board easily and quickly, so as to greatly improve the convenience on operation and to reduce the manpower cost required by locking.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A positioning assembly, for positioning a circuit board on a case, wherein the circuit board shifts relative to the case along a integrate direction or a release direction, so as to get caught on the case or be detached from the case, comprising:
   a fixed member, disposed on the case, and having two suspending elastic arms opposite to each other, wherein a claw is formed at one side of the two elastic arms;
   a movable member, having two opposite guide chamfers actively contacting with the two elastic arms of the fixed member, such that the two elastic arms deform to expand the width of the claw; and
   a latching member, mounted on one side of the circuit board facing to the movable member, wherein the width of the latching member is greater than the width of the claw of the fixed member, the latching member shifts along the integrate direction, the latching member pushes the claw of the two elastic arms to deform, and shifts to a top end of the claw, such that the claw leans against and limits the latching member, thereby fixing the circuit board on the case.

2. The positioning assembly as claimed in claim 1, wherein the fixed member has two slots respectively disposed to the two elastic arms, the two guide chamfers respectively have a pivot disposed at one side corresponding to the slot, wherein each pivot is respectively inserted in the two slots, so as to guide the movable member to shift relative to the fixed member.

3. The positioning assembly as claimed in claim 1, wherein the two elastic arms are spaced by a first width, and the two elastic arms normally maintain the first width.

4. The positioning assembly as claimed in claim 3, wherein the two guide chamfers have a second width, and the first width is smaller than the second width.

5. The positioning assembly as claimed in claim 4, wherein the two guide chamfers of the movable member push the two elastic arms of the fixed member to deform, so as to spread the two elastic arms to make the first width deform to a third width.

6. The positioning assembly as claimed in claim 5, wherein the third width is greater than the width of the latching member, so as to release the latching member from the electronic device.

7. The positioning assembly as claimed in claim 1, wherein the movable member further comprises a protruding rib, disposed between one ends of the two guide chamfers, so as to drive the movable member to shift along the release direction.

8. The positioning assembly as claimed in claim 1, wherein at least one hook is further disposed on the case for hooking the fixed member, such that the fixed member is fixed on the case.

9. The positioning assembly as claimed in claim 1, wherein the latching member further has a bump, one side of the circuit board has a hole corresponding to the bump, the bump and the hole are engaged with each other, such that the latching member is secured on the circuit board.

10. The positioning assembly as claimed in claim 1, wherein the circuit board further has at least one combination hole, the case has at least one combination post, the combination hole is combined to the combination post, such that the circuit board is caught by the case.

\* \* \* \* \*